(12) United States Patent
Deguenther

(10) Patent No.: US 9,804,499 B2
(45) Date of Patent: *Oct. 31, 2017

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 367 days.

This patent is subject to a terminal disclaimer.

(21) Appl. No.: 13/932,167

(22) Filed: Jul. 1, 2013

(65) Prior Publication Data

US 2013/0293861 A1  Nov. 7, 2013

Related U.S. Application Data

(63) Continuation of application No. PCT/EP2011/000416, filed on Jan. 29, 2011.

(51) Int. Cl.
*G03B 27/72* (2006.01)
*G03B 27/54* (2006.01)
*G03F 7/20* (2006.01)

(52) U.S. Cl.
CPC ...... *G03F 7/70116* (2013.01); *G03F 7/70075* (2013.01); *G03F 7/70083* (2013.01); *G03F 7/70191* (2013.01)

(58) Field of Classification Search
CPC ............ G03F 7/70075; G03F 7/70083; G03F 7/70091; G03F 7/70108; G03F 7/70116;
(Continued)

(56) References Cited

U.S. PATENT DOCUMENTS 5,615,047 A  3/1997  Komatsuda et al.
6,049,374 A  4/2000  Komatsuda et al.
(Continued)

FOREIGN PATENT DOCUMENTS

DE  10 2009 045 219  3/2011
EP  1 168 083 A2  1/2002
(Continued)

OTHER PUBLICATIONS

International Search Report for corresponding Appl No. PCT/EP2011/000416, dated Nov. 8, 2011.
(Continued)

*Primary Examiner* — Christina Riddle
(74) *Attorney, Agent, or Firm* — Fish & Richardson P.C.

(57) ABSTRACT

An illumination system of a microlithographic projection exposure apparatus comprises an optical integrator having a plurality of light entrance facets and a beam deflection array of reflective or transparent beam deflecting elements. Each beam deflecting element is configured to illuminate a spot on the optical integrator at a position that is variable by changing a deflection angle produced by the beam deflecting element. The illumination system further comprises a control unit which is configured to control the beam deflection elements in such a manner that a light pattern assembled from the spots on at least one of the light entrance facets is varied in response to an input command that a field dependency of the angular irradiance distribution in a mask plane shall be modified.

22 Claims, 7 Drawing Sheets

(58) Field of Classification Search
CPC .............. G03F 7/70125; G03F 7/70141; G03F 7/70191; G03F 7/702; G03F 7/70558; G03F 7/70583
USPC ......... 355/52, 53, 55, 67–71, 77; 250/492.1, 250/492.2, 492.22, 493.1, 548; 430/5, 8, 430/22, 30, 311, 312, 321
See application file for complete search history.

(56) References Cited

U.S. PATENT DOCUMENTS

| | | | |
|---|---|---|---|
| 6,259,512 B1 * | 7/2001 | Mizouchi | 355/67 |
| 7,061,582 B2 | 6/2006 | Zinn et al. | |
| 8,755,031 B2 | 6/2014 | Deguenther | |
| 9,213,244 B2 | 12/2015 | Patra et al. | |
| 9,678,438 B2 | 6/2017 | Patra et al. | |
| 2002/0136351 A1 * | 9/2002 | Singer | 378/34 |
| 2003/0038225 A1 | 2/2003 | Mulder et al. | |
| 2004/0108467 A1 * | 6/2004 | Eurlings et al. | 250/492.1 |
| 2006/0087634 A1 | 4/2006 | Brown et al. | |
| 2006/0175556 A1 * | 8/2006 | Yabuki | G03F 7/70116 250/492.1 |
| 2007/0165202 A1 * | 7/2007 | Koehler et al. | 355/67 |
| 2009/0021715 A1 * | 1/2009 | Deguenther et al. | 355/67 |
| 2009/0053618 A1 * | 2/2009 | Goehnermeier | 430/5 |
| 2009/0116093 A1 | 5/2009 | Tanitsu | |
| 2009/0135392 A1 * | 5/2009 | Muramatsu | 355/67 |
| 2010/0157269 A1 | 6/2010 | Deguenther et al. | |
| 2010/0265482 A1 | 10/2010 | Schubert et al. | |
| 2011/0122388 A1 | 5/2011 | Deguenther | |
| 2011/0211183 A1 | 9/2011 | Tanitsu | |
| 2013/0114060 A1 | 5/2013 | Patra et al. | |
| 2014/0247437 A1 | 9/2014 | Deguenther | |
| 2016/0070176 A1 | 3/2016 | Patra et al. | |

FOREIGN PATENT DOCUMENTS

| | | | |
|---|---|---|---|
| EP | 1 170 625 A2 | 1/2002 | |
| EP | 1 170 635 A2 | 1/2002 | |
| EP | 1 262 836 A1 | 12/2002 | |
| EP | 1 357 431 | 10/2003 | |
| EP | 2146248 A1 * | 1/2010 | G03F 7/20 |
| JP | 11-003849 | 1/1999 | |
| JP | 2003-022967 A | 1/2003 | |
| JP | 2003-218017 | 7/2003 | |
| JP | 2010-067866 | 3/2010 | |
| JP | 2010-537414 | 12/2010 | |
| WO | WO 2005/026843 | 3/2005 | |
| WO | WO 2007/093433 | 8/2007 | |
| WO | WO 2009/026947 | 3/2009 | |
| WO | WO 2010/006687 | 1/2010 | |
| WO | WO 2010/024106 | 3/2010 | |
| WO | WO 2011/039261 | 4/2011 | |

OTHER PUBLICATIONS

E. Delano, "First-order Design and the Diagram", Applied Optics, 1963, vol. 2, No. 12, pp. 1251-1256.

* cited by examiner

ILLUMINATION SYSTEM OF A MICROLITHOGRAPHIC PROJECTION EXPOSURE APPARATUS

FIELD OF THE INVENTION

The invention generally relates to illumination systems for illuminating a mask in microlithographic exposure apparatus, and in particular to such systems comprising an array of mirrors or other beam deflecting elements to define the irradiance distribution in a pupil plane. The invention also relates to a method of operating such illumination systems.

DESCRIPTION OF RELATED ART

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning means. Commonly used masks contain transmissive or reflective patterns and may be of the binary, alternating phase-shift, attenuated phase-shift or various hybrid mask type, for example. However, there are also active masks, e.g. masks realized as a programmable mirror array. Also programmable LCD arrays may be used as active masks.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may require a different angular distribution than small sized features. The most commonly used angular distributions of projection light are referred to as conventional, annular, dipole and quadrupole illumination settings. These terms refer to the irradiance distribution in a system pupil plane of the illumination system. With an annular illumination setting, for example, only an annular region is illuminated in the system pupil plane. Thus there is only a small range of angles present in the angular distribution of the projection light, and thus all light rays impinge obliquely with similar angles onto the mask.

Different means are known in the art to modify the angular distribution of the projection light in the mask plane so as to achieve the desired illumination setting. In the simplest case a stop (diaphragm) comprising one or more apertures is positioned in a pupil plane of the illumination system. Since locations in a pupil plane translate into angles in a Fourier related field plane such as the mask plane, the size, shape and location of the aperture(s) in the system pupil plane determines the angular distributions in the mask plane. However, any change of the illumination setting requires a replacement of the stop. This makes it difficult to finally adjust the illumination setting, because this would require a very large number of stops that have aperture(s) with slightly different sizes, shapes or locations. Furthermore, the use of stops inevitably results in light losses which reduces the throughput of the apparatus.

Many common illumination systems therefore comprise adjustable elements that make it possible, at least to a certain extent, to continuously vary the illumination of the pupil plane. Recently it has been proposed to use mirror arrays that illuminate the pupil plane.

In EP 1 262 836 A1 the mirror array is realized as a micro-electromechanical system (MEMS) comprising more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil plane translates the reflection angles produced by the mirrors into locations in the pupil plane. This known illumination system makes it possible to illuminate the pupil plane with a plurality of circular spots, wherein each spot is associated with one particular microscopic mirror and is freely movable across the pupil plane by tilting this mirror.

Similar illumination systems are known from US 2006/0087634 A1, U.S. Pat. No. 7,061,582 B2 and WO 2005/026843 A2.

The illumination system disclosed in WO 2010/006687 A1 uses a mirror array not only to determine the angular, but also the spatial irradiance distribution in the mask plane. To this end the mirror produces spots being so small that different light patterns can be produced on the light entrance facets of the optical integrator. Since these light entrance facets are optically conjugate with the mask plane, a particular light pattern produced on a light entrance facet is directly imaged to the mask plane. The ability to vary the geometry of the illuminated field can be used to eliminate the need for adjustable blades in the illumination system. Such blades are used in apparatus of the scanner type at the beginning and the end of each scanning cycle to enlarge or to reduce the illuminated field along the scan direction. It is also described that, at a given instance, different light entrance facets may be illuminated with different light patterns so as to produce a spatial irradiance distribution having a smooth profile.

SUMMARY OF THE INVENTION

It is an object of the present invention to provide an illumination system which makes it possible not only to vary the geometry of the illuminated field, but also to produce different field dependencies of the angular light distribution at the mask plane.

This object is achieved, in accordance with the present invention, by an illumination system comprising a pupil plane, a mask plane in which a mask to be illuminated can be arranged, and an optical integrator. The latter is configured to produce a plurality of secondary light sources located in the pupil plane. The optical integrator has a plurality of light entrance facets each being associated with one of the secondary light sources. The illumination system further comprises a beam deflecting device which comprises a beam deflection array of reflective or transparent beam deflecting elements. Each beam deflecting element is configured to illuminate a spot on the light entrance facets at a position that is variable by changing the deflection angle produced by the beam deflecting element. The spots illuminated by the beam deflecting elements have a total area that is at least five times, preferably at least ten times, more preferably at least twenty times smaller than the maximum total area of at least one of the light entrance facets. In accordance with the present invention a control unit is provided which is configured to control the beam deflection elements in such a manner that a light pattern assembled from the spots on at least one of the light entrance facets is varied in response to an input command that a field dependency of the angular irradiance distribution on the mask plane shall be modified.

Typically such an input command will be issued by an overall system control, which coordinates the operation of the entire projection exposure apparatus, if a new mask containing different feature patterns is to be projected, or if it is attempted with an existing mask to improve the imaging quality by performing fine adjustments of the field dependency of the angular irradiance distribution.

The invention is based on the idea that the capability of producing different light patterns on the light entrance facets cannot only be used to produce different geometries of the illuminated field, but also to produce different field dependencies of the angular irradiance distribution. Instead of spatially "mixing" light entrance facets on which different light patterns are produced so that the effect on the angular irradiance distribution can be neglected, as it is described in the aforementioned WO 2010/006687 A1, the invention proposes to selectively arrange differently illuminated light entrance facets such that those light entrance facets illuminated in the same way are arranged in a configuration that corresponds to a desired illumination setting. For example, the configuration may be such that the light entrance facets on which identical portions are illuminated are arranged in the form of an annulus, a number of poles or a disk centered with respect to the optical axis. Then it is possible to illuminate on the mask several portions with different angular irradiance distributions.

For example, the control unit may be configured to control the beam deflection elements in such a manner that a first angular irradiance distribution is produced at a first portion of an illuminated field, which is illuminated in the mask plane by the illumination system, and a second angular irradiance distribution, which is distinct from the first angular irradiance distribution, is produced at a second portion of the illuminated field.

The first portion may be a two-dimensional area in which the first angular irradiance distribution is uniform, and the second portion may also be a two-dimensional area in which the second angular irradiance distribution is uniform.

Such a field dependency of the angular irradiance distribution may be useful for producing dies in which differently structured portions, for example central portions and peripheral portions, require different illumination settings if these portions shall be imaged with an optimum imaging quality on the light sensitive surface.

The first portion and the second portion may not overlap so that the transition between the two different angular irradiance distributions is discontinuous (i.e. step-like). However, also (quasi-)continuous transitions between different angular irradiance distributions can easily be achieved with the help of the illumination system in accordance with the present invention.

The illuminated field may have a long dimension along an X direction and a short dimension along a Y direction which is perpendicular to the X direction and is parallel to a scan direction of the projection exposure apparatus. The first portion may then have at least one Y coordinate, but no X coordinate in common with the second portion. In other words, the portions are arranged next to each other along the X direction which is perpendicular to the scan direction.

The first and second angular irradiance distributions may be associated with illumination settings taken from the group consisting of: Conventional illumination setting, angular illumination setting, dipole illumination setting, n-pole illumination setting with n>=3.

In one embodiment the illumination system comprises a spatial light modulator that is arranged in a light propagation path between the beam deflecting device and the optical integrator and that is configured to transmit or to reflect impinging light in a spatially resolved manner. Such a light modulator may be useful to define the light pattern of the light entrance facets more sharply so that very abrupt transitions between different angular irradiance distributions at mask level can be achieved.

To this end the spatial light modulator may comprise a further beam deflection array of reflective or transparent beam deflecting elements. Each beam deflecting element of the further beam deflection array may be capable to be in an "on"-state, in which it directs impinging light towards the optical integrator, and in an "off"-state, in which it directs impinging light elsewhere. Such a beam deflection array having digital switching properties may be realized as a digital mirror device (DMD) and may contain hundreds of thousands or even a few million individual micromirrors.

If a spatial light modulator comprising a beam deflection array is used, the illumination system may comprise an objective that images the beam deflection array onto the light entrance facets of the optical integrator. Then the sharp edges of the beam deflecting elements are sharply imaged by the objective onto the light entrance facets of the optical integrator.

The control unit may be configured to control the beam deflection elements in such a manner that a light pattern, which comprises at least two areas with different non-zero irradiances, is produced on at least one light entrance facet. Such light patterns with stepped irradiance profiles inevitably occur if two or more different illumination settings shall be produced simultaneously, provided that the areas illuminated in the pupil plane for the different illumination settings overlap, but have different total sizes.

In some embodiments the optical integrator comprises an array of reflective or diffractive microelements. Each microelement is associated with one light entrance facet. The microelements may be realized as microlenses or diffractive optical elements, for example.

The beam deflection elements of the beam deflecting device may be configured as mirrors which can be tilted by two tilt axes forming an angle there-between. In another embodiment, the beam deflection elements are electro-optical or acousto-optical elements.

The above stated object is also achieved by an illumination system comprising an optical integrator having a plurality of light entrance facets and a beam deflection array of reflective or transparent beam deflecting elements. Each beam deflecting element is configured to illuminate a spot on the optical integrator at a position that is variable by changing a deflection angle produced by the beam deflecting element. A control unit is configured to control the beam deflection elements in such a manner that a light pattern assembled from the spots on at least one of the light entrance facets is varied in response to an output command that a field dependency of the angular irradiance distribution in a mask plane shall be modified.

According to a second aspect of the invention, the above stated object is achieved, in accordance with the present invention, by an illumination system comprising a pupil plane, a mask plane in which a mask to be illuminated can be arranged, and an optical integrator. The latter is configured to produce a plurality of secondary light sources located in the pupil plane. The optical integrator has a plurality of light entrance facets each being associated with one of the secondary light sources. The illumination system further comprises a beam deflecting device which comprises a beam deflection array of reflective or transparent beam deflecting elements. Each beam deflecting element is configured to illuminate a spot on the light entrance facets at a position that is variable by changing the deflection angle produced by the beam deflecting element. The spots illuminated by the beam deflecting elements have a total area that is at least five times, preferably at least ten times, more preferably at least twenty times smaller than the maximum total area of at least one of the light entrance facets. In accordance with the present invention a control unit is provided which is configured to control the beam deflection elements in such a manner that a light pattern, which comprises at least two areas with different non-zero irradiances, is produced on at least one light entrance facet.

It is also an object of the present invention to provide a method of operating an illumination system of a microlithographic projection exposure apparatus which makes it possible for an operator not only to vary the geometry of the illuminated field, but also to produce different field dependencies of the angular light distribution at the mask plane.

This object is achieved in accordance with the present invention by a method comprising the following steps:

a) providing an illumination system of a microlithographic projection exposure apparatus, wherein the illumination system comprises an optical integrator having a plurality of light entrance facets;

b) producing light patterns, which are assembled from individual spots, on the light entrance facets of the optical integrator;

c) determining that a field dependency of the angular irradiance distribution in a mask plane shall change;

d) varying the light patterns on the light entrance facets by rearranging and/or removal and/or adding spots.

The remarks made above with regard to the illumination system in accordance with the present invention apply to the method, mutatis mutandis, too.

The light patterns may be varied in step d) such that a first angular irradiance distribution is produced at a first portion of an illuminated field, which is illuminated in the mask plane by the illumination system. A second angular irradiance distribution, which is distinct from the first angular irradiance distribution, is produced at a second portion of the illuminated field.

The first portion may be a two-dimensional area in which the first angular irradiance distribution is uniform. The second portion may also be a two-dimensional area in which the second angular irradiance distribution is uniform.

The illuminated field may have a long dimension along an X direction and a short dimension along a Y direction which is perpendicular to the X direction and parallel to a scan direction of the projection exposure apparatus. The first portion may have at least one Y coordinate, but no X coordinate, in common with the second portion.

The illumination system provided in step a) may comprise a beam deflecting device which comprises a beam deflection array of reflective or transparent beam deflecting elements. The light patterns are then varied by changing the deflection angles produced by the beam deflection elements.

The spots may have a total area that is at least five times, preferably at least ten times, more preferably at least twenty times, smaller than the maximum total area of any of the light entrance facets.

The light pattern may be varied in step d) such that a light pattern, which comprises at least two areas with different non-zero irradiances, is produced on at least one light entrance facet.

DEFINITIONS

The term "light" is used herein to denote any electromagnetic radiation, in particular visible light, UV, DUV, VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote light that passes through a particular lens or another optical element.

The term "position" is used herein to denote the location of a reference point of a body in the three-dimensional space. The position is usually indicated by a set of three Cartesian coordinates. The orientation and the position therefore fully describe the placement of a body in the three-dimensional space.

The term "surface" is used herein to denote any plane or curved surface in the three-dimensional space. The surface may be part of a body or may be completely separated therefrom, as it is usually the case with a field or a pupil plane.

The term "field plane" is used herein to denote a plane that is optically conjugate to the mask plane.

The term "pupil plane" is used herein to denote a plane in which marginal rays passing through different points in the mask plane intersect. As usual in the art, the term "pupil plane" is also used if it is in fact not a plane in the mathematical sense, but is slightly curved so that, in the strict sense, it should be referred to as pupil surface.

The term "uniform" is used herein to denote a property that does not depend on the position.

The term "optical raster element" is used herein to denote any optical element, for example a lens, a prism or a diffractive optical element, which is arranged, together with other identical or similar optical raster elements so that each optical raster element is associated with one of a plurality of adjacent optical channels.

The term "optical integrator" is used herein to denote an optical system that increases the product NA·a, wherein NA is the numerical aperture and a is the illuminated field area.

The term "condenser" is used herein to denote an optical element or an optical system that establishes (at least approximately) a Fourier relationship between two planes, for example a field plane and a pupil plane.

The term "conjugated plane" is used herein to denote planes between which an imaging relationship is established. More information relating to the concept of conjugate planes are described in an essay E. Delano entitled: "First-order Design and the y, ȳ Diagram", Applied Optics, 1963, vol. 2, no. 12, pages 1251-1256.

The term "field dependency" is used herein to denote any functional dependency of a physical quantity from the position in a field plane.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point in the surface. If applied to a field plane, the spatial irradiance distribution necessarily integrates the irradiances produced by a plurality of light bundles.

The term "angular irradiance distribution" is used herein to denote how the irradiance of a light bundle varies depending on the angles of the light rays that constitute the light bundle. Usually the angular irradiance distribution can be described by a function $I_\alpha(\alpha, \beta)$, with $\alpha$, $\beta$ being angular coordinates describing the directions of the light rays. If the angular irradiance distribution has a field dependency, $I_\alpha$ will be also a function of field coordinates, i.e. $I_\alpha=I_\alpha(\alpha, \beta, x, y)$.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I. General Construction of Projection Exposure Apparatus

Figure 1:
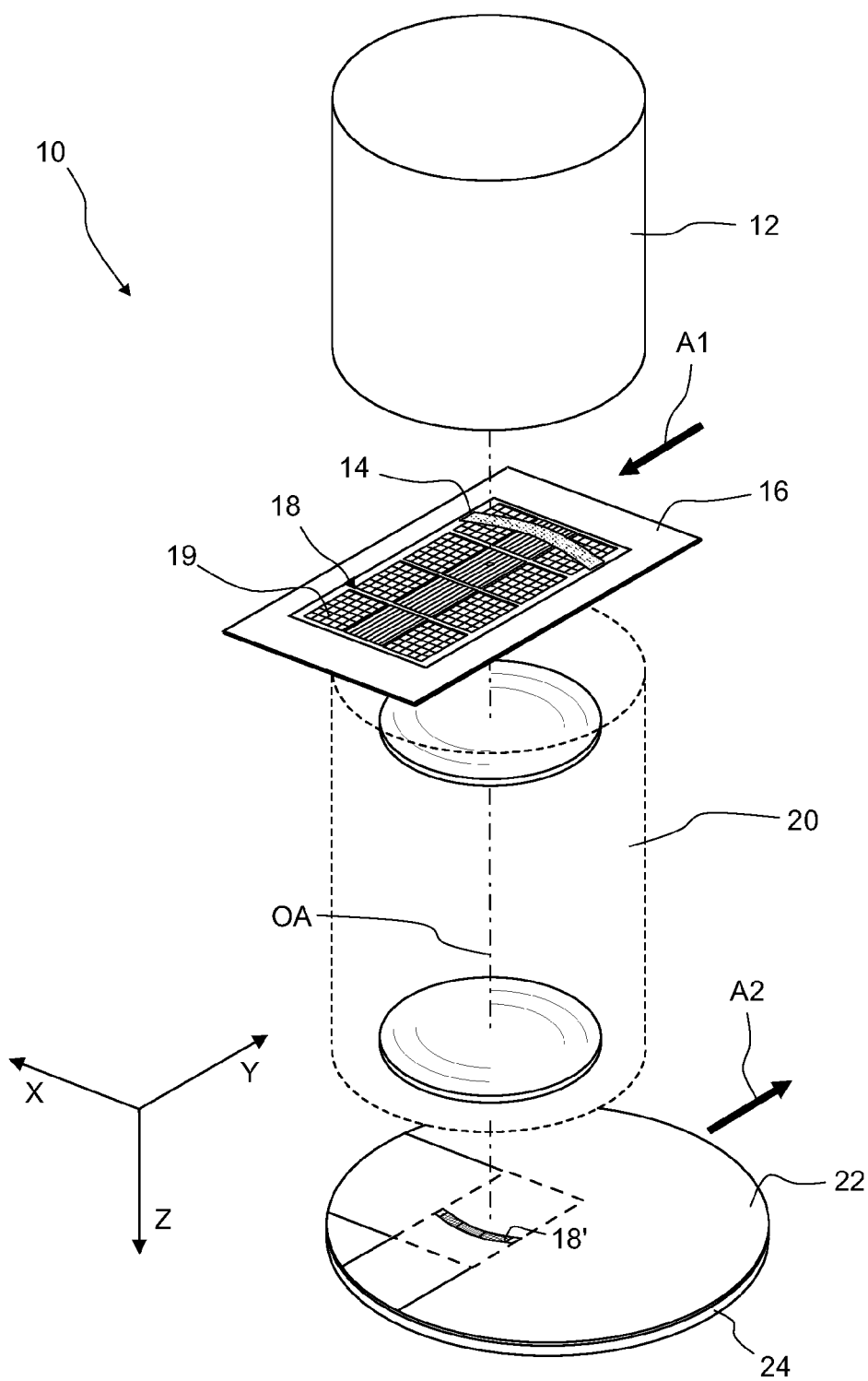
FIG. 1 is a schematic perspective view of a projection exposure apparatus in accordance with one embodiment of the present invention.

FIG. 1 is a perspective and highly simplified view of a projection exposure apparatus 10 in accordance with the present invention. The apparatus 10 comprises an illumination system 12 which produces a projection light beam. The latter illuminates a field 14 on a mask 16 containing a pattern 18 formed by a plurality of small features 19 that are schematically indicated in FIG. 1 as thin lines. In this embodiment the illuminated field 14 has the shape of a ring segment. However, other shapes of the illuminated field 14, for example rectangles, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification $\beta$ with $|\beta|<1$, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification $\beta$ of the projection objective 20. If the projection objective 20 inverts the image ($\beta<0$), the mask 16 and the substrate 24 move in opposite directions, as this is indicated in FIG. 1 by arrows A1 and A2. However, the present invention may also be used in stepper tools in which the mask 16 and the substrate 24 do not move during projection of the mask.

II. Multiple Illumination Setting

Figure 2:
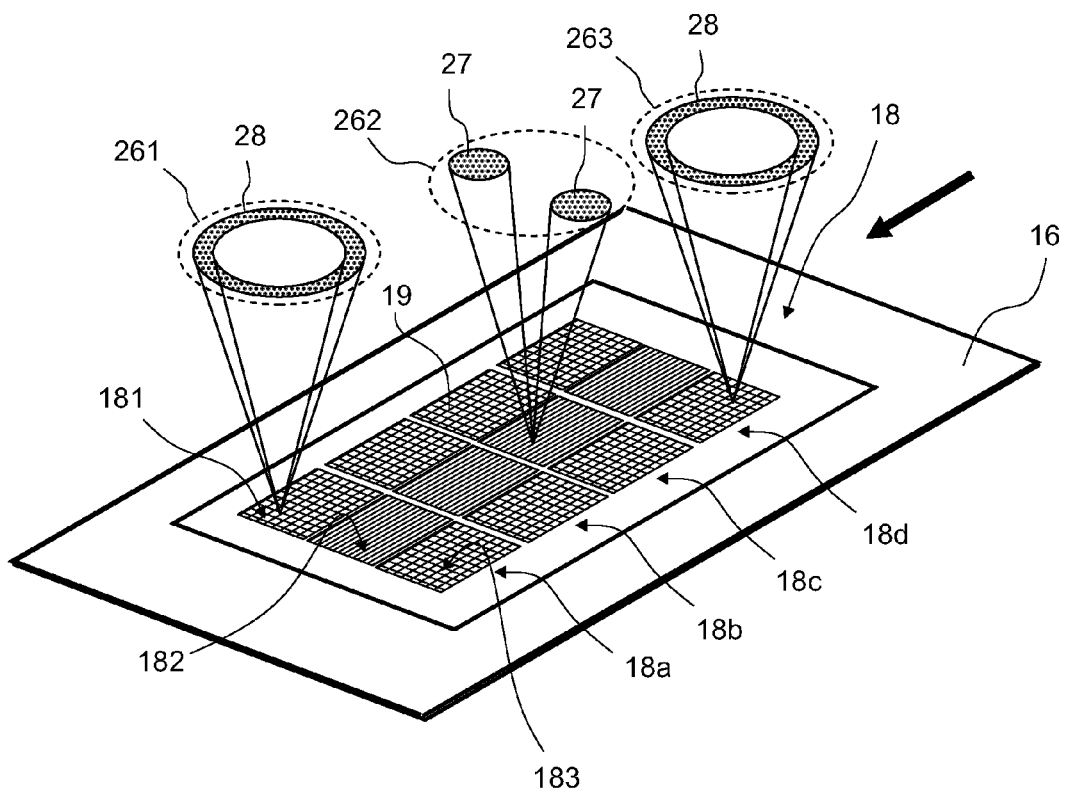
FIG. 2 is an enlarged perspective view of the mask to be projected by the projection exposure apparatus shown in FIG. 1.

FIG. 2 is an enlarged perspective view of the mask 16. The pattern 18 on this mask comprises four identical pattern areas 18a, 18b, 18c and 18d which are arranged one behind the other along the Y direction. Each pattern area 18a, 18b, 18c and 18d comprises in this embodiment a first portion 181, a second portion 182 and a third portion 183. The portions 181, 182, 183 are arranged next to each other along the X direction so that they do not overlap. This implies that the portions 181, 182, 183 have no X coordinate in common.

For the sake of simplicity it is assumed that the first and third portions 181 and 183 each contain features 19 extending along the X direction and features 19 extending along the Y direction. The second portion contains only features 19 that extend along the Y direction.

The mask 16 shown in FIG. 2 may be used in a manufacturing step in which four identical dies are exposed subsequently during a single scanning cycle. The dies correspond to the four pattern areas 18a, 18b, 18c and 18d. On each die central structures corresponding to the second portion 182 and peripheral structures corresponding to the first and third portions 181, 183 shall be produced. When the scanning cycle is completed so that the pattern areas 18a, 18b, 18c and 18d have been lithographically transferred to the four dies, the scanning direction is either reversed or the mask 16 is returned to its original position without any illumination. Then a further scanning cycle is performed with another set of dies.

In general, different patterns require different angular irradiance distributions at mask level if maximum image quality is desired. In this embodiment it is assumed that the features 19, which are arranged within the second portions 182 and extend along the Y direction, are best imaged on the light sensitive layer 22 with an X dipole illumination setting. In FIG. 2 a pupil 262 associated with a light bundle that converges towards a field point located in one of the second portions 182 is illustrated by a circle. In the pupil 262 two poles 27, which are spaced apart along the X direction, represent directions from which light propagates towards the field point. Since the features 19 are assumed to be uniformly distributed over the second portions 182, this X dipole illumination setting should be produced at each field point in the second portions 182.

The first and third portions 181, 183, which are associated with the peripheral structures of the dies, contain features 19 extending along the X direction and also features 19 extending along the Y direction. For these features 19 it is assumed that an annular illumination setting leads to the best image quality. FIG. 2 shows two annuli 28 which are illuminated in pupils 261, 263 associated with light bundles that converge towards field points in the first and third portions 181 and 183, respectively. This annular illumination setting should thus be produced at each field point in the first and third portions 181, 183.

This implies that the illumination system 12 must be capable of producing two different illumination settings simultaneously and side by side within the illuminated field 14. Speaking in more general terms, the illumination system 12 should be capable to produce a desired field dependency of the angular light distribution at mask level. This includes the ability to change from one field dependency to another field dependency. The field dependency P describes how the angular light distribution depends on the position in the illuminated field 14. For example, if the angular light distribution at Cartesian coordinates x, y in the illuminated field 14 is given by a function $I_\alpha(\alpha, \beta, x, y)$ with $\alpha$, $\beta$ denoting angles of incidence, the field dependency may be described by a set of expansion coefficients $\alpha_{ij}$ of a Taylor expansion (or using any other suitable expansion) in x, y.

In case of the mask shown in FIG. 2, the expansion coefficients would describe a sudden change of the distribution at the dividing lines that extend along the Y direction and separate the second portion 182 from the first and third portions 181, 183.

III. General Construction of Illumination System

Figure 3:
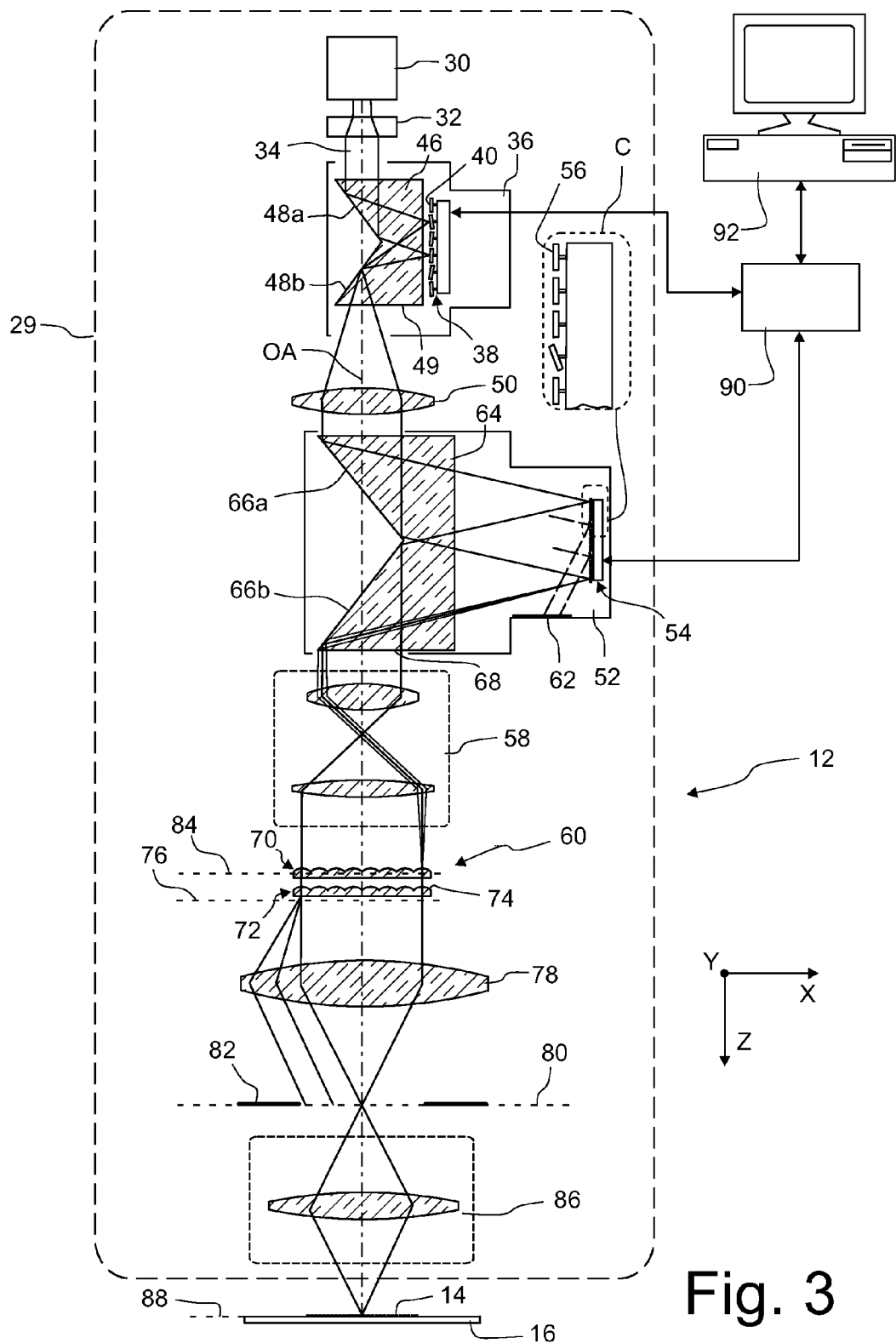
FIG. 3 is a meridional section through an illumination system being part of the apparatus shown in FIG. 1.

FIG. 3 is a meridional section through the illumination system 12 shown in FIG. 1. For the sake of clarity, the illustration of FIG. 3 is considerably simplified and not to scale. This particularly implies that different optical units are represented by one or very few optical elements only. In reality, these units may comprise significantly more lenses and other optical elements.

The illumination system 12 includes a housing 29 and a light source 30 that is, in the embodiment shown, realized as an excimer laser. The light source 30 emits projection light having a wavelength of about 193 nm. Other types of light sources 30 and other wavelengths, for example 248 nm or 157 nm, are also contemplated.

In the embodiment shown, the projection light emitted by the light source 30 enters a beam expansion unit 32 which outputs an expanded and almost collimated light beam 34. To this end the beam expansion unit 32 may comprise several lenses or may be realized as a mirror arrangement, for example.

Figure 4:
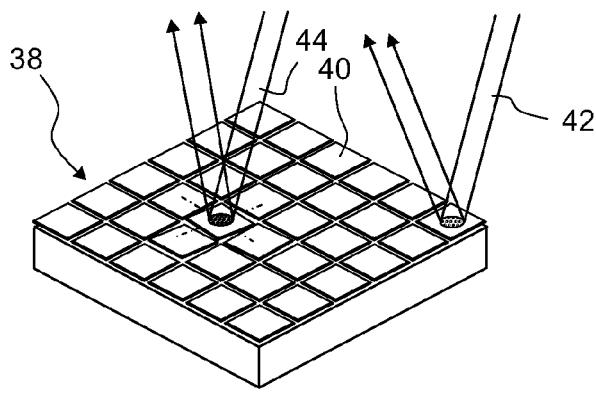
FIG. 4 is a perspective view of a mirror array contained in the illumination system shown in FIG. 3.

The projection light beam 34 then enters a pupil defining unit 36 that is used to produce variable spatial irradiance distributions in a subsequent plane. To this end the pupil defining unit 36 comprises a first mirror array 38 of very small mirrors 40 that can be tilted individually about two orthogonal axes with the help of actuators. FIG. 4 is a perspective view of the first mirror array 38 illustrating how two parallel light beams 42, 44 are reflected into different directions depending on the tilting angles of the mirrors 40 on which the light beams 42, 44 impinge. In FIGS. 3 and 4 the first mirror array 38 comprises only 66 mirrors 40; in reality the first mirror array 38 may comprise several hundreds or even several thousands mirrors 40.

The pupil defining unit 36 further comprises a prism 46 having a first plane surface 48a and a second plane surface 48b that are both inclined with respect to an optical axis OA of the illumination system 12. At these inclined surfaces 48a, 48b impinging light is reflected by total internal reflection. The first surface 48a reflects the impinging light towards the mirrors 40 of the first mirror array 38, and the second surface 48b directs the light reflected from the mirrors 40 towards an exit surface 49 of the prism 46. The angular irradiance distribution of the light emerging from the exit surface 49 can thus be varied by individually tilting the mirrors 40 of the first mirror array 38. More details with regard to the pupil defining unit 38 can be gleaned from US 2009/0116093 A1.

The angular irradiance distribution produced by the pupil defining unit 36 is transformed into a spatial irradiance distribution with the help of a first condenser 50. The condenser 50, which may be dispensed with in other embodiments, directs the impinging light towards a digital spatial light modulator 52 that is configured to reflect impinging light in a spatially resolved manner. To this end the digital spatial light modulator 52 comprises a second mirror array 54 of micromirrors 56 that can be seen best in the enlarged cut-out C. In contrast to the mirrors 40 of the first mirror array 38, however, each micromirror 56 of the second mirror array 54 has only two stable operating states, namely an "on" state, in which it directs impinging light via a first objective 58 towards an optical integrator 60, and an "off" state, in which it directs impinging towards a light absorbing surface 62.

The second mirror array 54 may be realized as a digital mirror device (DMD), as they are commonly used in beamers, for example. Such devices may comprise up to several million micromirrors that can be switched between the two operating states many thousands times per second.

Similar to the pupil defining unit 36, the spatial light modulator 52 further comprises a prism 64 having an entrance surface 65 that is arranged perpendicular to the optical axis OA and a first plane surface 66a and a second plane surface 66b that are both inclined with respect to the optical axis OA of the illumination system 12. At these inclined surfaces 66a, 66b impinging light is reflected by total internal reflection. The first surface 66a reflects the impinging light towards the micromirrors 56 of the second mirror array 54, and the second surface 66b directs the light reflected from the micromirrors 56 towards an exit surface 68 of the prism 64.

If all micromirrors 56 of the second mirror array 54 are in their "on" state, the second mirror array 54 has substantially the effect of a plane beam folding mirror. However, if one or more micromirrors 56 are switched to their "off" state, the spatial irradiance distribution of the light emerging from the exit surface 68 is modified. This can be used, in a manner that will be explained in more detail further below with reference to FIGS. 11 and 12, to clip the spatial irradiance distribution which is produced on the optical integrator 60.

As it already has been mentioned above, the light emerging from the exit surface 68 of the prism 64 passes through the first objective 58 and impinges on the optical integrator 60. Since the light passing through the first objective 58 is almost collimated, the first objective 58 may have a very low numerical aperture (for example 0.01 or even below) and thus can be realized with a few small spherical lenses. The first objective 58 images the second mirror array 54 onto the optical integrator 60.

Figure 5:
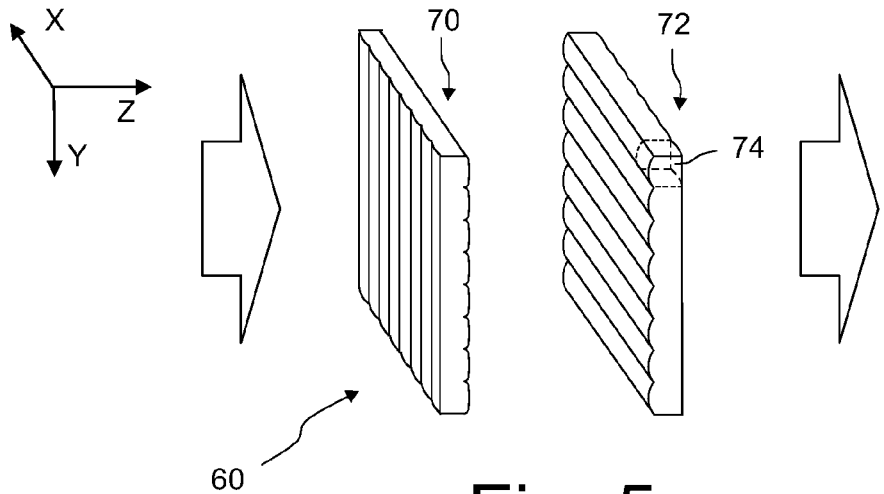
FIG. 5 is a perspective view of two arrays of optical raster elements contained in the illumination system shown in FIG. 3.

The optical integrator 60 comprises, in this embodiment, a first array 70 and a second array 72 of optical raster elements 74. FIG. 5 is a perspective view of the two arrays 70, 72. Each array 70, 72 comprises, on each side of a support plate, a set of cylinder lenses that extend along the X and the Y direction, respectively. The volumes where two cylinder lenses cross form optical raster elements 74. Thus each optical raster element 74 may be regarded as a microlens having cylindrically curved surfaces. The use of cylinder lenses is advantageous particularly in those cases in which the refractive power of the optical raster elements 74 shall be different along the X and the Y direction.

Figures 6, 7:
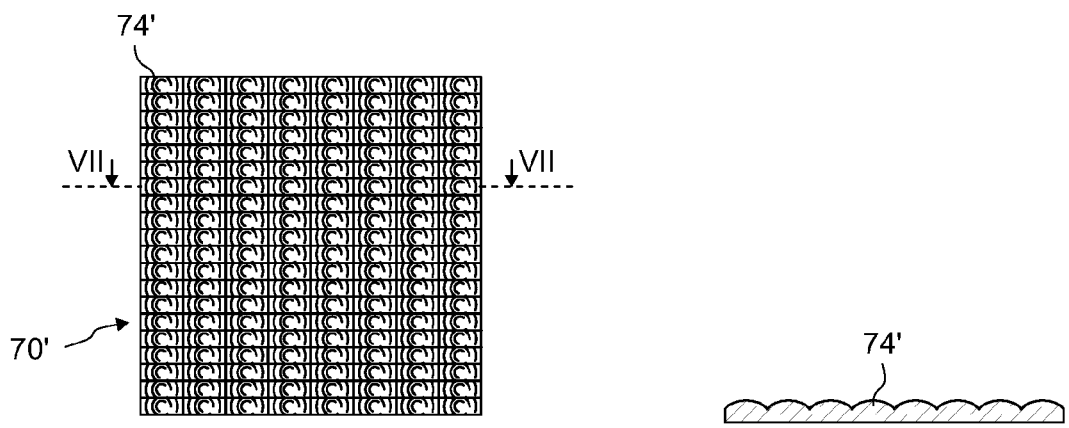
FIG. 6 is a top view on an array of optical raster elements that may alternatively be contained in the illumination system shown in FIG. 3.
FIG. 7 is a sectional view along line VII-VII of the array shown in FIG. 6.

FIGS. 6 and 7 show a first array 70' of optical raster elements 74' according to an alternative embodiment in a top view and a sectional view along line VII-VII, respectively. Here the optical raster elements 74' are formed by plano-convex lenses having a rectangular contour. The second array differs from the first array 70' only with regard to the curvature of the convex surface of the optical raster elements 74'.

Referring again to FIG. 3, the optical raster elements 74 of the first and second array 70, 72 respectively, are arranged one behind the other in such a way that one optical raster element 74 of the first array 70 is associated in a one to one correspondence with one optical raster element 74 of the second array 72. The two optical raster elements 74, which are associated with each other, are aligned along a common axis and define an optical channel. Within the optical integrator 60 a light beam which propagates in one optical channel does not cross or superimpose with light beams propagating in other optical channels. In other words, the optical channels which are associated with the optical raster elements 74 are optically isolated from each other.

In this embodiment a pupil plane 76 of the illumination system 12 is located behind the second array 72; however, it may equally be arranged in front of it. A second condenser 78 establishes a Fourier relationship between the pupil plane 76 and a field stop plane 80 in which an adjustable field stop 82 is arranged.

The field stop plane 80 is optically conjugated to a raster field plane 84 which is located within or in close proximity to the first array 70 of the optical integrator 60. This means that each area in the raster field plane 84 within an optical channel is imaged onto the entire field stop plane 80 by the associated optical raster element 74 of the second array 72 and the second condenser 78. The images of the illuminated areas within the optical channels superimpose in the field stop plane 80, and this results in its very homogenous illumination. This process is often described by identifying the illuminated areas in the optical channels with secondary light sources that commonly illuminate the field stop plane 80.

The field stop plane 80 is imaged by a second objective 86 onto a mask plane 88 in which the mask 16 is arranged with the help of a mask stage (not shown). The adjustable field stop 82 is also imaged on the mask plane 88 and defines at least the short lateral sides of the illuminated field 14 extending along the scan direction Y.

The pupil defining unit 36 and the spatial light modulator 52 are connected to a control unit 90 which is, in turn, connected to an overall system control 92 illustrated as a personal computer. The control unit 90 is configured to control the mirrors 40 of the pupil defining unit 36 and the micromirrors 56 of the spatial light modulator 52 in such a manner that a desired field dependency of the angular irradiance distribution in the mask plane 88 is obtained.

In the following it will be described with reference to FIGS. 8 to 13 how this is accomplished.

III. Function and Control of the Illumination System

1. Spot Formation

Figure 8:
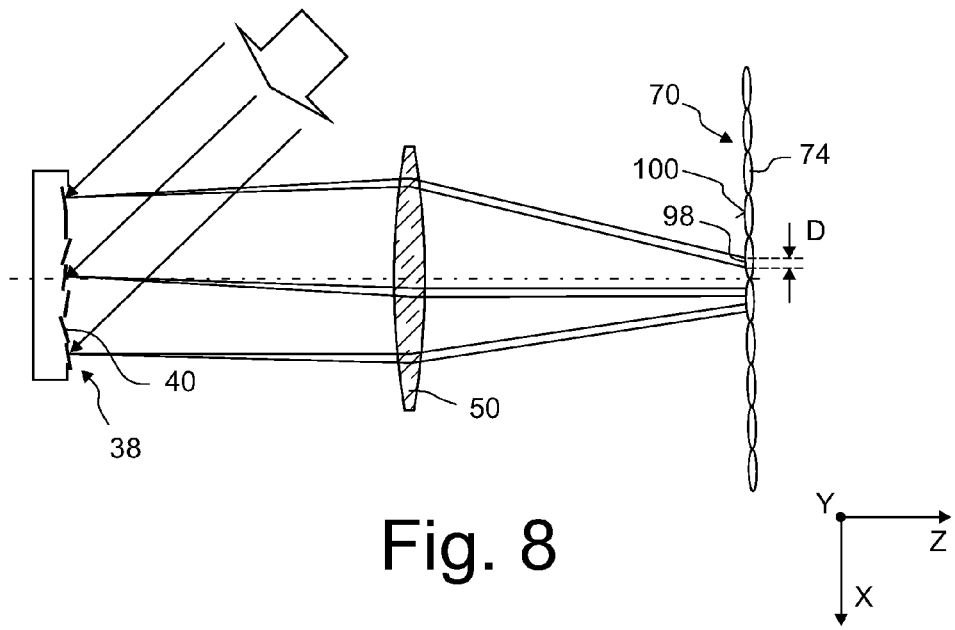
FIG. 8 is a schematic meridional section through a portion of the illumination system in which only a mirror array, a condenser and an array of optical raster elements are shown.

FIG. 8 is a schematic cut-out from FIG. 3 showing the first mirror array 38, the first condenser 50 and some of the optical raster elements 74 of the first array 70 of the optical integrator 60. In this embodiment the optical raster elements 74 are illustrated as rotationally symmetrical biconvex lenses having rectangular borderlines.

Each mirror 40 of the first mirror array 38 produces a light beam which illuminates a small spot 98 of diameter D on a light entrance facet 100 of one of the optical raster elements 74. The position of the spots 98 may be varied by tilting the mirrors 40. The geometry of the spots 98 depends, among others, on the optical properties of the mirrors 40 of the first mirror array 38. If there is an additional microlens array between the beam expansion unit 32 which avoids projection light to be absorbed in gaps between the mirrors 40, also such a microlens array will have an impact on the geometry of the spots 98. In some embodiments the geometry of the spots 98 is circular; in other embodiments the geometry may be approximately rectangular and in particular square.

As can be seen in FIG. 8, the diameter D of the spots 98 is smaller than the diameter of the light entrance facet 100 of the illuminated optical raster element 74. Generally the total area of each spot 98 illuminated on a light entrance facet 100 of an optical raster element 74 should be considerably, for example at least 5 times, preferably at least 10 times, more preferably at least 20 times, smaller than the area of the respective light entrance facet 100. If the light entrance facets 100 have different areas and each spot 98 can be produced on any of these facets, the maximum area of the light entrance facets 100 may be taken as reference.

If the spots 98 are sufficiently small in comparison to the light entrance facets 100 of the optical raster elements 74, it is possible to produce different light patterns on the light entrance facets 100. The light patterns may be easily varied by suitably controlling the mirror elements 40 with the help of the control unit 90.

2. Effect of Light Pattern Variation

Since the light entrance facets 100 are located in the raster field plane 84, the patterns are imaged, via the optical raster elements 74 of the second array 72 and the second condenser 78, on the intermediate field plane 80.

Figure 9:
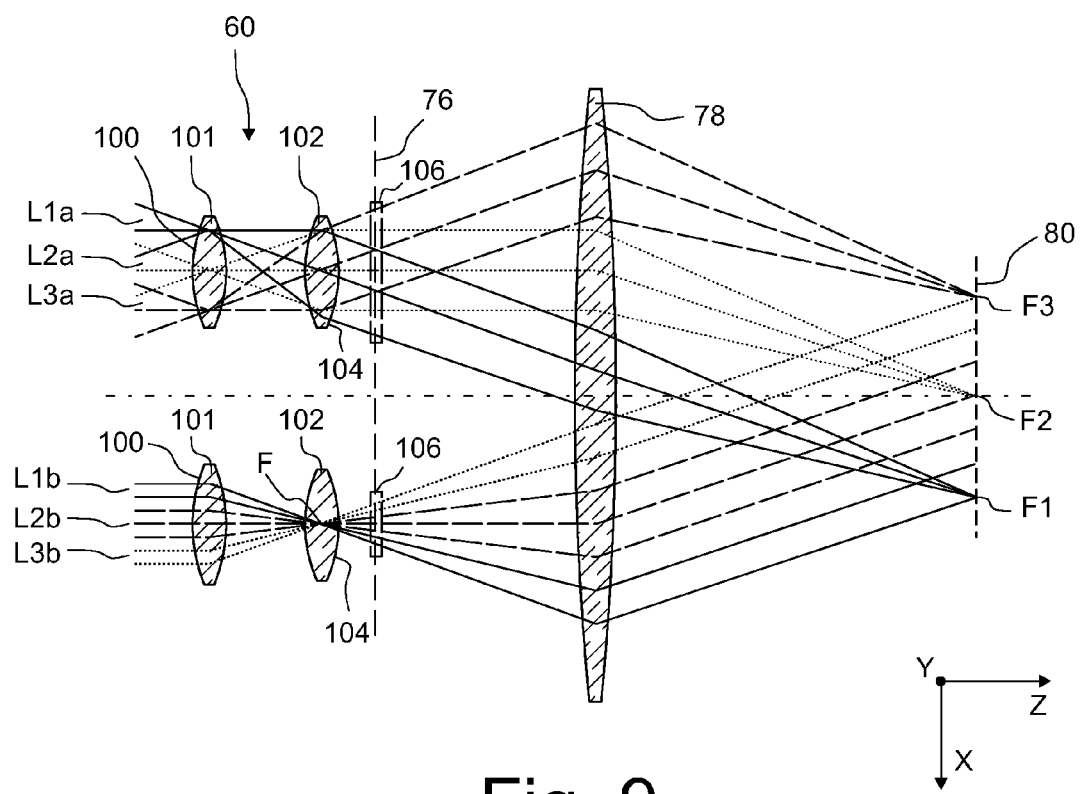
FIG. 9 is an enlarged cut-out of FIG. 3 showing first and second microlenses of the optical raster element and a condenser lens.

This will now be explained with reference to FIG. 9 which is an enlarged and not to scale cut-out of FIG. 3 showing a portion of the optical integrator 60, the second condenser 78 and the intermediate field plane 80. For the sake of simplicity only two pairs of optical raster elements 74 of the optical integrator 60 are shown in FIG. 9. Two optical raster elements 74 that are associated with a single optical channel are referred to in the following as first microlens 101 and second microlens 102. As mentioned above, the microlenses 101, 102, which are sometimes also referred to as field and pupil honeycomb lenses, may be configured as individual microlenses having rotationally symmetrical refractive surfaces and a rectangular borderline, or as crossed cylindrical microlenses as shown in FIG. 5, for example. It is only required that the microlenses 101, 102 have at least along one direction perpendicular to an optical axis OA of the illumination system 12 a none-zero optical power.

Each pair of microlenses 101, 102 associated to a particular optical channel produces a secondary light source 106 in the pupil plane 76. In the upper half of FIG. 9 it is assumed that converging light bundles L1a, L2a and L3a illustrated with solid, dotted and broken lines, respectively, impinge on different points of the light entrance facet 100 of the first microlens 101. After having passed the two microlenses 101, 102 and the condenser 78, each light bundle L1a, L2a and L3a converges to a focal point F1, F2 and F3, respectively. From the upper half of FIG. 9 it thus becomes clear that the positions where light rays impinge on the light entrance facet 100 and the positions where these light rays pass the intermediate field plane 80 (or any other conjugated field plane) are optically conjugate.

The lower half of FIG. 9 illustrates the case when collimated light bundles L1b, L2b and L3b impinge on different regions of the light entrance facet 100 of the first microlens 101. This is the more realistic case because the light impinging on the optical integrator 60 is usually indeed substantially collimated. The light bundles L1b, L2b and L3b are focused in a common focal point F located in the second microlens 102 and then pass, now collimated again, the intermediate field plane 80. Again it can be seen that, as a result of the optical conjugation, the region where a light bundle L1b, L2b and L3b impinges on the light entrance facet 100 corresponds to the region which is illuminated in the intermediate field plane 80.

The dimension of the field illuminated in the intermediate field plane 80 (and thus the field 14 illuminated in the mask plane 88) can therefore be varied by changing the region that is illuminated on the light entrance facet 100 of the first microlens 101. The size and geometry of this region can be changed very efficiently by reassembling the spots 98 with the help of the first mirror array 38 of the pupil defining unit 36, as it has been explained above with reference to FIG. 8.

As a matter of course, these considerations apply separately for the X and the Y direction. Thus the geometry of the illuminated field 14 can be varied independently for the X and Y direction by varying the illumination of the light entrance facets 100 separately for the X and Y direction, respectively. In other words, almost any arbitrary geometry of the field illuminated in the intermediate field plane 80 can be obtained if the region illuminated on the light entrance facets 100 of the first microlenses 101 is suitably determined.

For example, if one first microlens 101 is illuminated with a light bundle L1b as shown in the lower half of FIG. 9 and another first microlens 101 is illuminated with a light bundle L2b, the secondary light sources associated with the two different first microlenses 101 will illuminate different portions in the intermediate field plane 80. The crucial point in this respect, however, is that two different first microlenses 101 can be located at different positions, and consequently the associated secondary light sources illuminate the intermediate field plane 80 from different directions. In other words, different portions in the intermediate field plane 80 will then be illuminated with different angular light distributions.

Figure 10:
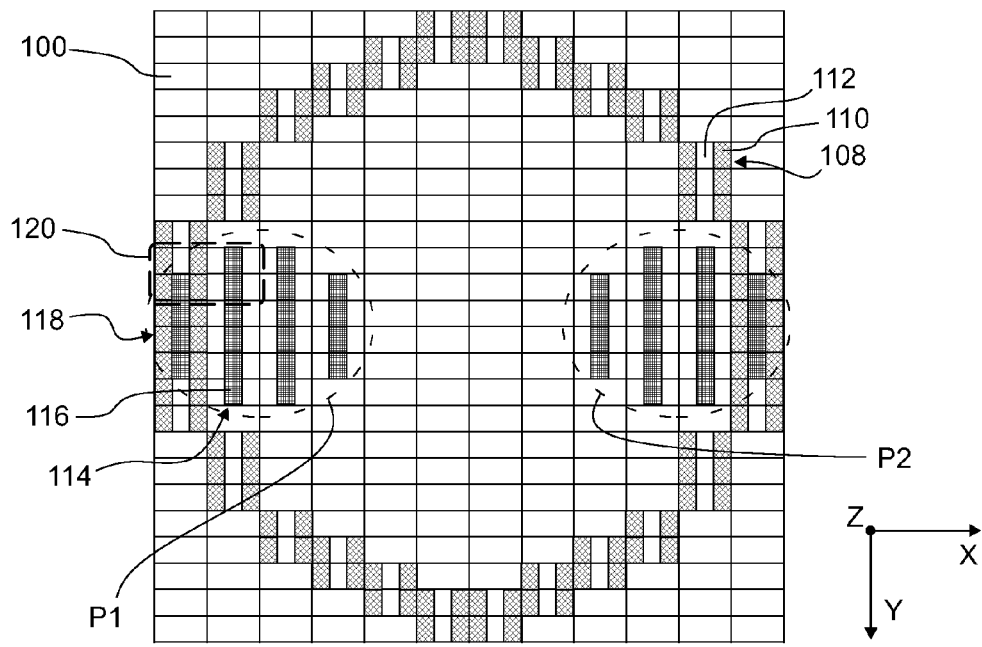
FIG. 10 is a top view on the spatial irradiance distribution on the light entrance facets of the optical integrator.

FIG. 10 is an exemplary top view on the light entrance facets 100 of a plurality of first microlenses 101 of the optical integrator 60. Some of the light entrance facets 100 are illuminated with the help of the pupil defining unit 36 with first light patterns 108. Each light pattern 108 comprises two lateral stripes 110 extending along the Y direction and being separated from each other by an area 112 which is not illuminated. The light entrance facets 100 illuminated with the first light pattern 108 are arranged over the entrance surface of the optical integrator 60 such that they form approximately an annulus.

Other light entrance facets 100 are illuminated with second light patterns 114 which comprise only an illuminated central stripe 116 that also extends along the Y direction. The irradiance at the central stripes 116 of the second light pattern 114 is three times as large as the irradiance at the lateral stripes 110 of the first light pattern 108. The light entrance facets 100 which are illuminated with the second light patterns 114 are arranged such that they form two approximately circular poles P1, P2 that are spaced apart along the X direction.

A few light entrance facets 100 are illuminated with a third light pattern 118 which is a superposition of the first light pattern 108 and the second light pattern 114. These light entrance facets 100 are therefore the only ones that are completely illuminated, but with a stepped irradiance distribution.

Those first microlenses 101 whose light entrance facet 100 is illuminated with the first light pattern 108 or the third light pattern 118, commonly illuminate in the intermediate field plane 80, and consequently in the mask plane 88, two portions that have the same principal geometry as the lateral stripes 110 of the first light pattern 108. Since these light entrance facets 100 are arranged at the entrance side of the optical integrator 60 in the shape of an annulus, the secondary light sources associated with these light entrance facets 100 illuminate these portions (only) obliquely, as it is characteristic of an annular illumination setting. As a result, the first and third portions 181, 183 on the mask 16 are illuminated with an annular angular light distribution, as it is illustrated in FIG. 2.

Those light entrance facets 100 which are illuminated with the second and third light patterns 108, 118 contribute to the illumination of a central stripe in the illuminated field 14. This stripe has the same width as the second portion 182 of the pattern areas 18a, 18b, 18c and 18d shown in FIG. 2. Since these light entrance facets 100 are arranged on the entrance side of the optical integrator 60 such that they form two poles P1, P2, the central stripe in the illuminated field 14 is illuminated with an X dipole illumination setting, as it is shown in FIG. 2.

Thus it is possible to produce simultaneously two different illumination settings at different portions of the illuminated field 14.

Since the irradiance of the central stripes 116 of the second light pattern 114 is three times as large as the irradiance of the lateral stripes 110 of the first light pattern 108, the first and third portions 181, 183 are illuminated with the same irradiance as the second portion 182. This is due to the fact that the total area covered by all lateral stripes 110 is three times as large as the total area covered by the central stripes 116.

By suitably rearranging the spots 98 on the light entrance facets 100 of the optical integrator 60 with the help of the control unit 90, it is thus possible to produce almost any arbitrary field dependency of the angular light distribution in the mask plane 88.

3. Function of Spatial Light Modulator

In the following the function of the spatial light modulator 52 will be explained with reference to FIGS. 11 and 12.

If the portions 181, 182, 183 of the pattern areas 18a, 18b, 18c and 18d shown in FIG. 2 do not overlap, but abut on each other at a sharp dividing line, it may be necessary, in order to avoid a compromised imaging quality in the vicinity of the dividing line, that the angular light distribution changes abruptly over a very short distance. This implies that the first, second and third light patterns 108, 114 and 118 produced on the light entrance facets 100 of the optical integrator 60 have very sharp inner and outer borderlines. Mathematically speaking, the irradiance distribution defining the light patterns 108, 114 and 118 should then correspond very closely to a step function. Otherwise there would be a broad transition zone in which points on the mask 16 are illuminated with a mixture of two or more different angular irradiance distributions.

As it has been explained above with reference to FIG. 8, the light patterns 108, 114 and 118 are assembled from small spots 98 with the help of the pupil defining unit 36. Sharp inner and outer borderlines of the light patterns 108, 114, 118 can be achieved if the diameter D of the spots 98 is very small, for example in the range between 25 µm and 100 µm. One way to achieve this is the use of extremely small mirrors 40 in the pupil defining unit 36. However, at present there are some technological constraints that make it difficult to produce and reliably operate a first mirror array 38 that comprises such small mirrors 40. With significantly larger mirrors 40, diffraction would result in a diameter D of the spots 98 that is—for typical values of the focal length of the first condenser 50 and the size of the mirrors 40—in the range of a few hundred micrometers. This may be too large to produce the desired sharp inner and outer borderlines of the light patterns 108, 114, 118.

The optional spatial light modulator 52 makes it possible to solve this problem. The pupil defining unit 36 produces, together with the first condenser 50, an irradiance distribution not directly on the entrance side of the optical integrator 60, but on the second mirror array 44 of the spatial light modulator 52. As it has been explained above, the number of micromirrors 56 of the second mirror array 54 is considerably larger than the number of mirrors 40 of the first mirror array 38. Furthermore, the micromirrors 56 are only capable to be switched between an "on"-state and an "off"-state, as it is shown in the cutout C in FIG. 3. Thus a light pattern having blurred borderlines due to diffraction can be "sharpened" or clipped by simply switching those micromirrors 56, on which undesired light impinges, in the "off"-state.

Figure 11:
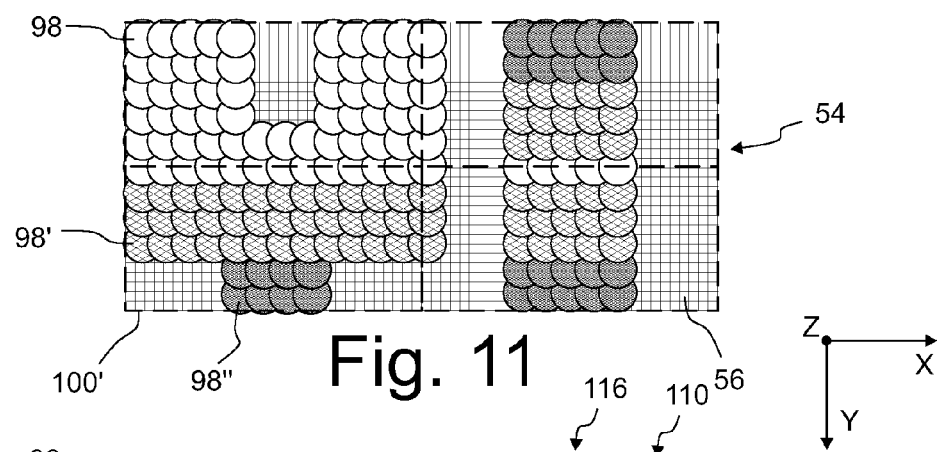
FIG. 11 is a top view on the irradiance distribution produced on a mirror array of the spatial light modulator.

This is illustrated in FIG. 11 which is a top view on a portion of the second mirror array 54. White circles 98 indicate spots that are produced by the pupil defining unit 36 and which are associated with individual mirrors 40 thereof. More densely hatched spots 98' are a result of superimposing two spots 98 one on top of the other, and the most densely hatched spots 98" are a result of superimposing five spots 98 one on top of the other.

It can be seen in FIG. 11 that, due to the significant size of the spots 98, 98', 98", the borderlines between illuminated and non-illuminated areas are fringed. Since the micromirrors 56 of the second mirror array 54 are imaged by the objective 58 onto the raster field plane 84 in which the light entrance facets 100 of the optical integrator 60 are arranged, such a fringed irradiance distribution would also be observed on the light entrance facets 100 if all micromirrors 56 were in the "on"-state. For the purpose of illustration, broken lines 100' indicate in FIG. 11 four contiguous regions that will be imaged by the first objective 58 on those four contiguous light entrance facets of the optical integrator 60 that are indicated in FIG. 10 by 120.

Figure 12:
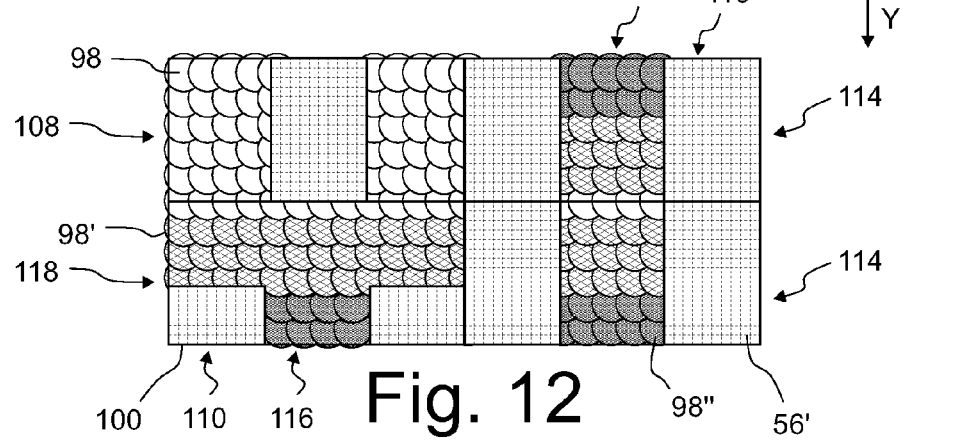
FIG. 12 is an image of the irradiance distribution shown in FIG. 11 and produced on four contiguous light entrance facets of the optical integrator.

FIG. 12 is a top view on these four light entrance facets 100 of the optical integrator 60 if those micromirrors 56 are switched to the "off"-state that are located in portions illuminated by the undesired fringes. The images of all (also non-illuminated) micromirrors 56 are indicated in FIG. 12 by broken lines 56'. Since the micromirrors 56 of the second mirror array 54 have sharp edges, the irradiance distribution on the optical integrator 60 is clipped so that the undesired fringes are removed.

On the light entrance facet 100 located in the upper left corner of FIG. 12 the first light pattern 108 is produced with the help of the first and second mirror arrays 38, 54. The second light pattern 114 is produced on the two light entrance facets 100 on the right hand side of FIG. 12. It can be seen that the irradiance distribution in the central stripe 116 is not uniform in this embodiment. This is because the total irradiance in this central stripe needs to be three time the irradiance in the lateral stripes 110 of the first light pattern 108. However, strictly speaking this is true only for the scan integrated irradiance (sometimes also referred to as total light dose). Thus, instead of superimposing three spots 98 one on top of the other in the central stripe 116, there are combinations of two superimposed spots 98' and five superimposed spots 98" that result, after scan integration, in the desired integrated irradiance.

A similar approach has also been taken for the light entrance facet 100 located in the left bottom corner. Here the third light pattern 118 shall be produced. The central stripe 116 is composed of the same arrangement of spots as it is used for producing the central stripe 116 of the second light pattern 114. However, the lateral stripes 110 are composed in a different way compared to the first light pattern 108. More specifically, each lateral stripe 110 comprises a non-illuminated portion that is delimited by sharp borderlines against the central stripe 116. This "lost" irradiance is added to the remaining portion. This ensures, after scan integration, that the total irradiance in the central stripe 116 is three times as large as the irradiance in the lateral stripes 110, but there is nevertheless a sharp irradiance step between the central stripe 116 and the two lateral stripes 110.

IV. Important Method Steps

Figure 13:
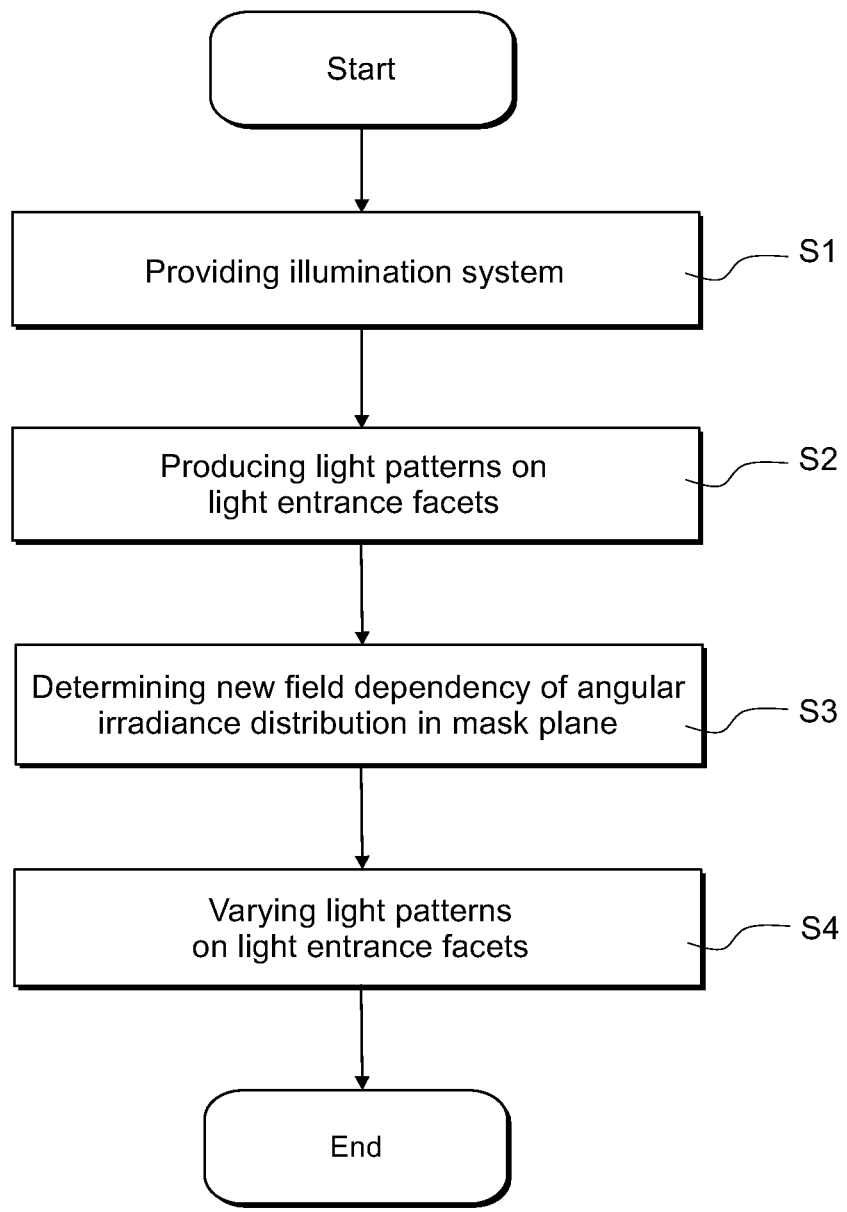
FIG. 13 is a flow diagram that illustrates important method steps.

Important method steps of the present invention will now be summarized with reference to the flow diagram shown in FIG. 13.

In a first step S1 an illumination system 12 is provided.

In a second step S2 light patterns on light entrance facets 100 of an optical integrator 60 are produced with the help of the pupil defining unit 36. If, at a given instant, different light patterns are produced on different light entrance facets 100, the angular irradiance distribution in the illuminated field will be non-uniform. In other words, there is a field dependency of the angular irradiance distribution in the mask plane.

In a third step S3 a new field dependency of the angular irradiance distribution in the mask plane is determined. This step S3 is usually carried out if a new mask 16 containing a different pattern 18 shall be projected on the light sensitive surface 22. Another reason for changing the field dependency may be an attempt to improve the imaging quality of the projection objective 20.

In a fourth step S4 the light patterns on the light entrance facets 100 of the optical integrator 60 are varied such that the new field dependency of the angular irradiance distribution in the mask plane determined in the step S3 is obtained.

The invention claimed is:

1. An illumination system having a pupil plane and an illumination plane, the illumination system comprising:
an optical integrator configured to produce a plurality of secondary light sources in the pupil plane, the optical integrator comprising a plurality of light entrance facets, each of the light entrance facets being associated with one of the secondary light sources;
a beam deflecting device comprising a beam deflection array of reflective or transparent beam deflecting elements, each beam deflecting element being configured to illuminate a spot on the light entrance facets at a position that is variable by changing a deflection angle produced by the beam deflecting element, a total area of the spots illuminated by the beam deflecting elements being at least 5 times smaller than a maximum total area of at least one of the light entrance facets; and
a control unit configured to, based on a received input command, control the beam deflection elements to vary a light pattern assembled from the spots on at least one of the light entrance facets so that the illumination system produces a first angular irradiance distribution at a first portion of the illuminated field and simultaneously a second angular irradiance distribution at a second portion of the illuminated field,
wherein the second angular irradiance distribution is different from the first angular irradiance distribution, and the illumination system is a microlithographic illumination system.

2. The illumination system of claim 1, wherein the total area of the spots illuminated by the beam deflecting elements being at least 10 times smaller than the maximum total area of at least one of the light entrance facets.

3. The illumination system of claim 1, wherein the total area of the spots illuminated by the beam deflecting elements being at least 20 times smaller than the maximum total area of at least one of the light entrance facets.

4. The illumination system of claim 1, wherein the first portion is a two-dimensional area in which the first angular irradiance distribution is uniform, and the second portion is a two-dimensional area in which the second angular irradiance distribution is uniform.

5. The illumination system of claim 4, wherein the first portion and the second portion do not overlap.

6. The illumination system of claim 1, further comprising a spatial light modulator in a light propagation path between the beam deflecting device and the optical integrator, the spatial light modulator being configured to: transmit impinging light in a spatially resolved manner; or reflect impinging light in a spatially resolved manner.

7. The illumination system of claim 6, wherein:
the spatial light modulator comprises a further beam deflection array of reflective or transparent beam deflecting elements;
each beam deflecting element of the further beam deflection array has a first state and a second state;
for each beam deflecting element of the further beam deflection array, in its first state the beam deflecting element directs impinging light toward the optical integrator; and
for each beam deflecting element of the further beam deflection array, in its second state the beam deflecting element does not direct impinging light toward the optical integrator.

8. The illumination system of claim 7, further comprising an objective configured to image the further beam deflection array onto the light entrance facets of the optical integrator.

9. The illumination system of claim 1, wherein the control unit is configured to control the beam deflection elements so that a light pattern is produced on at least one light entrance facet, the light pattern comprising at least two areas with different non-zero irradiances.

10. An apparatus, comprising:
an illumination system of claim 1; and
a projection objective configured to image an object in an object plane of the projection objective into an image plane of the projection objective,
wherein the apparatus is a microlithographic projection exposure apparatus, and the illumination plane of the illumination system is the object plane of the projection objective.

11. A method of operating a projection exposure apparatus comprising an illumination system and a projection objective, the method comprising:
using the projection objective to image a portion of an object in an object plane of the projection objective into an image plane of the projection objective,
wherein the illumination system is an illumination system according to claim 1, and the illumination plane of the illumination system is the object plane of the projection objective.

12. An illumination system, comprising
an optical integrator comprising a plurality of light entrance facets;
a beam deflection array of reflective or transparent beam deflecting elements, each beam deflecting element being configured to illuminate a spot on the optical integrator at a position that is variable by changing a deflection angle produced by the beam deflecting element; and a control unit configured to, based on a received input command, control the beam deflection elements to vary a light pattern assembled from the spots on at least one of the light entrance facets so that the illumination system produces a first angular irradiance distribution at a first portion of the illuminated field and simultaneously a second angular irradiance distribution at a second portion of the illuminated field, wherein the second angular irradiance distribution is different from the first angular irradiance distribution, and the illumination system is a microlithographic illumination system.

13. An apparatus, comprising:

an illumination system of claim 12; and a projection objective configured to image an object in an object plane of the projection objective into an image plane of the projection objective, wherein the apparatus is a microlithographic projection exposure apparatus, and the illumination plane of the illumination system is the object plane of the projection objective.

14. A method of operating a projection exposure apparatus comprising an illumination system and a projection objective, the method comprising:

using the projection objective to image a portion of an object in an object plane of the projection objective into an image plane of the projection objective, wherein the illumination system is an illumination system according to claim 12, and the illumination plane of the illumination system is the object plane of the projection objective.

15. The illumination system of claim 12, wherein the first portion is a two-dimensional area in which the first angular irradiance distribution is uniform, and the second portion is a two-dimensional area in which the second angular irradiance distribution is uniform.

16. The illumination system of claim 15, wherein the first portion and the second portion do not overlap.

17. A method of operating a microlithographic illumination system comprising an optical integrator comprising a plurality of light entrance facets, the method comprising:

i) producing light patterns on the light entrance facets of the optical integrator, the light patterns being assembled from individual spots; and ii) varying the light patterns on the light entrance facets by rearranging and/or removing and/or adding spots so that the illumination system produces a first angular irradiance distribution at a first portion of the illuminated field and simultaneously a second angular irradiance distribution at a second portion of the illuminated field, wherein the second angular irradiance distribution is different from the first angular irradiance distribution.

18. The method of claim 17, further comprising, before a), determining that the field dependency of the angular irradiance distribution in the illumination field should change.

19. The method of claim 18, wherein:

the illumination system further comprises a beam deflecting device and a spatial light modulator in a light propagation path between the beam deflecting device and the optical integrator;

the spatial light modulator comprises a further beam deflection array of reflective or transparent beam deflecting elements;

each beam deflecting element of the further beam deflection array has a first state and a second state;

for each beam deflecting element of the further beam deflection array, in its first state the beam deflecting element directs impinging light toward the optical integrator;

for each beam deflecting element of the further beam deflection array, in its second state the beam deflecting element does not direct impinging light toward the optical integrator.

20. The method of claim 19, further comprising changing a state of at least some of the beam deflecting elements between their respective first and second states.

21. The method of claim 17, wherein the first portion is a two-dimensional area in which the first angular irradiance distribution is uniform, and wherein the second portion is a two-dimensional area in which the second angular irradiance distribution is uniform.

22. The method of claim 21, wherein the light pattern is varied so that a light pattern is produced on at least one light entrance facet, the light pattern comprising at least two areas with different non-zero irradiances.

* * * * *